NEGATIVE RESISTANCE DISTRIBUTED AMPLIFIER

Filed Oct. 31, 1961 4 Sheets-Sheet 1

INVENTOR.
CLEMENT A. SKALSKI
BY Henry L. Shenier
ATTORNEY

INVENTOR.
CLEMENT A. SKALSKI
BY Henry L. Shenier
ATTORNEY

INVENTOR.
CLEMENT A. SKALSKI
BY Henry L. Shenier
ATTORNEY

NEGATIVE RESISTANCE DISTRIBUTED AMPLIFIER

Filed Oct. 31, 1961 4 Sheets-Sheet 4

INVENTOR.
CLEMENT A. SKALSKI
BY Henry L. Shenier
ATTORNEY 3,255,421

NEGATIVE RESISTANCE DISTRIBUTED AMPLIFIER

Clement A. Skalski, Norwalk, Conn., assignor to United Aircraft Corporation, East Hartford, Conn., a corporation of Delaware Filed Oct. 31, 1961, Ser. No. 149,085
13 Claims. (Cl. 330—34)

My invention relates to negative resistance distributed amplifiers and more particularly to amplifiers employing tunnel diodes which are incorporated into pi-section filters.

A tunnel diode is a degenerate p-n junction which exhibits a voltage-controlled negative resistance when forwardly biased by about 125 millivolts. The equivalent circuit of a forwardly biased tunnel diode reduces to a negative resistance shunted by the junction capacitance in series with the positive resistance and the inductance of the bulk material of the junction and its leads. A tunnel diode exhibits negative resistance up to its resistive cut-off frequency $w_t$ in radians/second, where $$(1) \qquad w_t=\frac{1}{RC}\sqrt{\frac{R}{r}-1}$$

where R is the negative resistance, where C is the junction capacitance, and where $r$ is the series positive resistance. The positive resistance $r$ is frequency dependent, having a value of zero as frequency approaches zero and increasing to the value $r$ at the frequency $w_t$. For a tunnel diode to be stably biased into its negative resistance region, $$(2) \qquad L\leq RCr$$

where L is the series inductance. Substituting Equation 1 in Equation 2 we may obtain the alternate expression for L, $$(3) \qquad L\leq\frac{(RC)R}{(w_tRC)^2+1}$$

In order to achieve a high resistive cut-off frequency $w_t$, it is necessary that the RC time constant of the tunnel diode be as small as possible. Highly doped tunnel diodes have an RC time constant as low as $10^{-11}$ second. The best pill type tunnel diode package with a diameter of 1/10 inch and a length of 1/16 inch has an inductance of 1/3 milli-micro-henry (mμh.). The value of $R/r$ may range from 2 to 25. Even if $R/r=2$ so that $w_t=(RC)^{-1}$ and $w_tRC=1$, yet R must be greater than 67 ohms if Equation 3 is to be satisfied and the diode stably biased. For amplifiers of even moderate gain, more than one tunnel diode must be used, since the usual input impedance level will not exceed 400 ohms. If the amplifier gain is increased by merely increasing the input impedance level, then the amplifier band-width will be proportionately impaired. However, a number of tunnel diodes may not be simply lumped in parallel, since the spacing must be at least 1/10 inch. The inductance of a wire varies proportionally to its length and inversely as a function of its diameter. For example, a 1/10 inch length of wire has an inductance of 1.4 mμh. if its diameter is 1/100 inch and an inductance of 0.45 mμh. if its diameter is 1/10 inch. It will be seen then that the series diode inductance would be more than doubled by the wire which putatively connects two diodes in parallel. This increases the difficulty of stably biasing the tunnel diode into its negative resistance region and requires that the negative resistance R be more than doubled. It will be seen then that no advantage results, since the negative resistance produced by two 133 ohm diodes in parallel is the same as that produced by a single 67 ohm diode. I have found that diodes can be effectively paralleled by incorporating them into pi filter sections terminated in characteristic resistances having predetermined relative magnitudes. To obtain high gain a large number of tapered filter sections must be employed having successively lower characteristic resistances $R_c$. As the characteristic resistance of a filter section becomes smaller, the pi section filter inductance must also decrease and finally becomes physically unrealizable if less than approximately 1/2 mμh. I have found that filter sections may be effectively paralleled by terminating them in characteristic resistances having predetermined polarities. The use of filter sections permits the gain to be increased without sacrificing amplifier band-width. My amplifier has a band-width which approaches the resistive cut-off frequency $w_t$.

One object of my invention is to provide a negative resistance distributed amplifier having a plurality of filter sections terminated in characteristic resistances of predetermined relative magnitudes.

A further object of my invention is to provide a negative resistance distributed amplifier having a plurality of filter sections terminated in characteristic resistances of predetermined polarities.

Other and further objects of my invention will appear in the following description:

In general, my invention contemplates incorporating the junction capacitance of a tunnel diode into two adjacent filter sections. This results in a change in the impedance level and, consequently, the characteristic resistance for the two sections. In a first embodiment of my invention the characteristic resistance of both sections is positive; and that section more remote from the input source has a lower characteristic resistance. The first embodiment of my invention will be termed "tapered positive line." In a second embodiment of my invention the two sections have negative characteristic resistances; and that section more remote from the input source has a higher characteristic resistance. The second embodiment of my invention will be termed "tapered negative line." In a third embodiment of my invention the two adjacent filter sections have characteristic resistances of equal magnitudes but of opposite polarities. The third embodiment of my invention will be termed "alternating line."

In the accompanying drawings which form part of the instant specification and which are to be read in conjunction therewith and in which like reference numerals are used to indicate like parts in the various views:

FIGURE 8 is a diagrammatic plan view of an extended alternating line as in FIGURE 7 showing the combination of loads.

Figures 1, 2, 3, 4, 5:
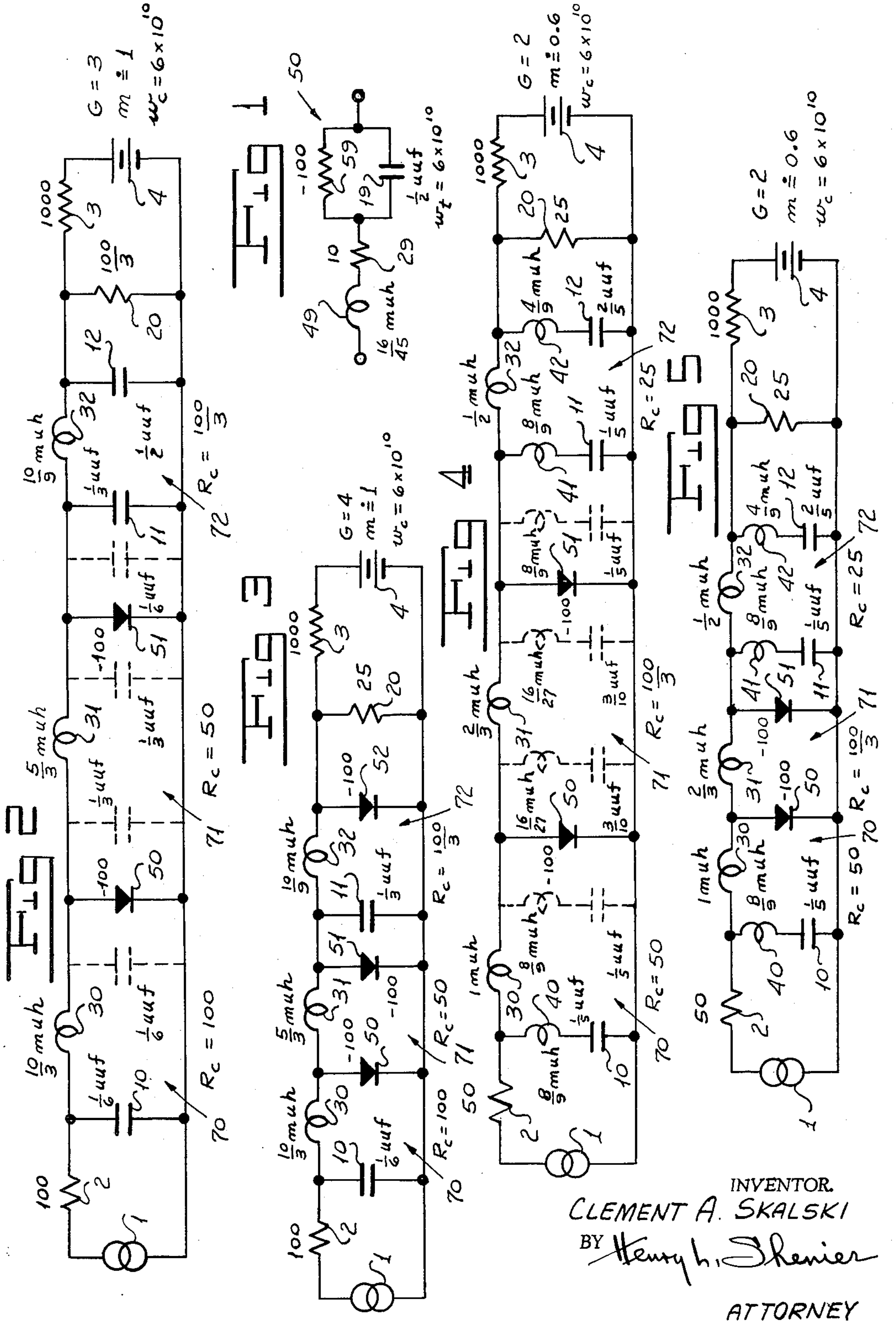
FIGURE 1 is a schematic view of the equivalent circuit of one of the tunnel diodes used in the tapered positive line.
FIGURE 2 is a schematic view of a tapered positive line of constant-$k$ pi sections, showing the division of the diode junction capacitance between adjacent sections.
FIGURE 3 is a schematic view of the reduced equivalent circuit of FIGURE 2 in which a terminating tunnel diode has been added.
FIGURE 4 is a schematic view of a tapered positive line of $m$-derived pi sections showing the division of diode junction capacitance and diode lead inductance between adjacent sections.
FIGURE 5 is a schematic view of the reduced equivalent circuit of FIGURE 4.

Referring more particularly now to FIGURE 1, the equivalent circuit of one of the tunnel diodes, indicated generally by the reference numeral 50, used in the tapered positive line of FIGURES 2 through 5 includes a −100 ohm negative resistance 59 shunted by a 1/2 micro-micro-farad ($\mu\mu$f.) capacitor 19 in series with a 16/45 m$\mu$h. inductor 49 and a frequency dependent resistor 29 having a value of 10 ohms at the resistive cut-off frequency $w_t$. It will be seen that $(RC)^{-1}=2\times10^{10}$ radians/second. However, the resistive cut-off frequency $w_t$ is greater than this value since $R/r$ is greater than 2. From Equation 1 $w_t=6\times10^{10}$ radians/second.

Referring now to FIGURE 2 a source of signal voltage 1 having an internal resistance 2 of 100 ohms drives a tapered positive line comprising the three constant-*k* pi section filters indicated generally by the reference numbers 70, 71, and 72 having the respective positive characteristic resistance $R_c$ of 100, 50 and 100/3 ohms. The tapered line is terminated in a load resistor 20 of 100/3 ohms. Tunnel diode 50 is shunt connected between sections 70 and 71; and a tunnel diode 51 is shunt connected between sections 71 and 72. Sections 70, 71, and 72 have series inductances 30, 31, and 32 of 10/3 m$\mu$h.,5/3 m$\mu$h., and 10/9 m$\mu$h. respectively. A bias source comprising a battery 4 in series with a resistor 3 shunts load resistor 20. The resistance of the bias resistor 3 should be large compared with that of load resistor 20 and thus may be 1000 ohms. Section 70 includes an initial 1/6 $\mu\mu$f. shunt capacitor 10; and section 72 includes a terminal 1/2 $\mu\mu$f. shunt capacitor 12.

As will be appreciated by those skilled in the art, each of the sections 70 through 72 has a cut-off frequency $w_c$ of $6\times10^{10}$ radians/sec. It will be noted that the characteristic resistance of the first section 70 is equal to the input resistance 2. Section 70 is terminated both by diode 50 and by the characteristic resistance of section 71. In order that the total terminating impedance of section 70 be 100 ohms, which is equal to its characteristic resistance, it is necessary that section 71 have a characteristic resistance of 50 ohms. Thus, the impedance transformation between sections 70 and 71 is two-to-one. The junction capacitance of diode 50 must be divided in the ratio of one-to-two between sections 70 and 71. Section 70 is shown as having a terminal 1/6 $\mu\mu$f. capacitor while section 71 is shown as having an initial 1/3 $\mu\mu$f. capacitor, the parallel combination of said capacitors being equal to the 1/2$\mu\mu$f. diode capacitance 19. Section 71 is terminated not only by diode 51 but also by section 72. In order that the equivalent terminating impedance of section 71 be 50 ohms, which is equal to its characteristic resistance, it is necessary that section 72 have a characteristic resistance of 100/3 ohms. Section 71 must have a terminal capacitance of 1/3 $\mu\mu$f.; and section 72 must have an initial capacitance of 1/2 $\mu\mu$f. The total capacitance in shunt with diode 51 must thus be 5/6 $\mu\mu$f. Since the capacitance of diode 51 is only 1/2 $\mu\mu$f., an additional 1/3 $\mu\mu$f. capacitor 11 must be added shunting diode 51. Resistor 20 terminates section 72 in its characteristic resistance. The gain G of the amplifier is equal to the ratio of input resistor 2 to output resistor 20 and is thus equal to three.

It is necessary for stability that the cut-off frequency $w_c$ of the filter sections be at least equal to the resistive cut-off frequency $w_t$ of the diode. We have shown $w_c$ to be equal to $w_t$. It will be appreciated that $w_c$ may be slightly greater than $w_t$ to afford a safety margin.

Referring now to FIGURE 3, I have shown the reduced equivalent circuit of FIGURE 1. It will be noted that the terminal 1/2 $\mu\mu$f. capacitor 12 of section 72 has been eliminated and an additional diode 52 substituted in its place. I may do this because terminal capacitor 12 has a value which is at least equal to that of the diode junction capacitance. Load resistor 20 is accordingly reduced to a value of 25 ohms. Section 72 is terminated not only by diode 52 but also by load resistor 20, the parallel combination of which yields an impedance which is equal to the characteristic resistance of section 72. The ratio of input resistor 2 to output resistor 20 is now four-to-one, which yields an amplifier gain G of four.

In the circuits of FIGURES 2 and 3 I have neglected the effect of the diode series inductance 49. If the ratio of $R/r$ is much greater than unity, then at the resistive cut-off frequency $w_t$, the equivalent circuit of diode 50 reduces to a series circuit comprising the lead inductance 49 in series with a capacitor which is substantially equal to the junction capacitance 19. This yields filter sections of the *m*-derived type. In an *m*-derived section the frequency of infinite attenuation exceeds the cut-off frequency of the sections and is substantially equal to the resonant frequency of inductor 49 and capacitor 19. As has been previously explained, the filter cut-off frequency $w_c$ must be at least equal to the resistive cut-off frequency $w_t$ of the diode. Thus, the frequency of the infinite attenuation must be greater than the diode cut-off frequency $w_t$. At frequencies above the resistive cut-off frequency $w_t$, the equivalent circuit of diode 50 reduces to inductor 49 in series with some positive resistance and a capacitance substantially equal to the diode junction capacitance 19. Thus, *m*-derived filter sections incorporating the tunnel diode do not produce infinite attenuation at any frequency. We may define the frequency $w_m$ as the frequency of maximum attenuation which is analogous to the frequency of infinite attenuation of conventional *m*-derived sections. It can be shown that $$w_m=\frac{1}{RC}\sqrt{\frac{R^2C}{L}-1}=\sqrt{\frac{1}{LC}-\frac{1}{(RC)^2}} \quad (4)$$

If $R/r$ is much greater than unity, then $$w_m\doteq\frac{1}{\sqrt{LC}} \quad (5)$$

For diode 50 the ratio $R/r=10$, which is considerably greater than unity; and thus Equation 5 is applicable. Substituting in Equation 5 we find $w_m\doteq7.5\times10^{10}$. It is well known that $$m=\sqrt{1-(w_c/w_m)^2} \quad (6)$$

Substituting in Equation 6 we find that $m\doteq0.6$ which is a value usually employed where it is desired that the characteristic resistance $R_c$ remain a relatively constant value substantially up to the cut-off frequency $w_c$.

Referring now to FIGURE 4, the input source 1 has an internal impedance of 50 ohms. Sections 70, 71 and 72 now have characteristic resistances $R_c$ of 50, 100/3, and 25 ohms respectively. Series inductors 30, 31, and 32 now have respective values of 1 m$\mu$h., 2/3 m$\mu$h., and 1/2 m$\mu$h. Section 70 is provided with an initial shunt leg comprising an 8/9 m$\mu$h. inductor 40 in series with a 1/5 $\mu\mu$f. capacitor 10. Diodes 50 and 51 are inserted in parallel between sections 70 and 71 and between sections 71 and 72 respectively. Section 72 is provided with a terminal shunt leg comprising a 4/9 mμh. inductor 42 in series with a 2/5 μμf. capacitor 12. Load resistor 20 has a value of 25 ohms. It will be noted that the value of inductor 30 of the 50 ohm *m*-derived section 70 is 0.6 times the value of inductor 31 of the 50 ohm constant-*k* section 71 of FIGURE 2. Likewise, inductor 31 of the 100/3 ohm m-derived section 71 is 0.6 times the value of inductor 32 of the 100/3 ohm constant-*k* section 72 of FIGURE 2. Each of the sections 70 through 72 has a cut-off frequency $w_c$ of $6\times10^{10}$; and thus the amplifier is stable. The characteristic resistance of section 70 is matched to the input resistance 2. Section 70 is terminated both by diode 50 and by section 71. Section 71 must have a characteristic resistance of 100/3 ohms in order that the total impedance terminating section 70 be equal to its characteristic resistance. The impedance transformation between section 70 and 71 afforded by diode 50 is in the ratio of three-to-two. Accordingly, the lead inductance 49 and the junction capacitance 19 must be divided between the sections 70 and 71 in the ratio of two-to-three. Section 70 is shown as having a terminal shunt leg comprising an 8/9 mμh. inductor and a 1/5 μμf. capacitor, while section 71 is shown with an initial shunt leg comprising a 16/17 mμh. inductor in series with a 3/10 μμf. capacitor, the parallel combination of said shunt legs being equal to the 16/49 mμh. diode inductance 49 in series with the 1/2 μμf. diode capacitance 19. Section 71 is terminated not only by diode 51 but also by section 72. In order that the equivalent terminating impedance of section 71 be equal to its characteristic resistance, it is necessary that section 72 have a characteristic resistance of 25 ohms. Section 71 must have a terminal shunt leg comprising a 16/27 mμh. inductor in series with a 3/10 μμf. capacitor; and section 72 must have an initial shunt leg comprising a 4/9 mμh. inductor in series with a 2/5 μμf. capacitor. Thus, an additional leg comprising an 8/9 mμh. inductor 41 in series with a 1/5 μμf. capacitor 11 must be added shunting tunnel diode 51. Resistor 20 terminates section 72 in its characteristic resistance. The ratio of input resistor 2 to output resistor 20 yields a gain G of two. It will be noted that each of the shunt legs is series resonant at the frequency of maximum attenuation $w_m$.

Referring now to FIGURE 5, I have shown the reduced equivalent circuit of FIGURE 4. It will be noted that, since capacitor 12 of the terminal shunt leg of section 72 has a value of only 2/5 μμf., which is less than the junction capacitance of diode 50, the terminal shunt leg cannot be eliminated and an additional tunnel diode substituted in its place as in FIGURE 3. It will be noted that each of the added shunt legs comprising inductors 40 through 42 and capacitors 10 through 12 do provide substantially infinite attenuation at the frequency $w_m$ since they ideally have no series resistance.

A constant-*k* filter section is a special case of an *m*-derived filter section in which the value of *m* is unity. It will be seen that for the diode of FIGURE 1, the assumption of an *m* value of unity in FIGURES 2 and 3 is not very accurate. However, FIGURES 2 and 3 do serve as a first approximation to the circuits of FIGURES 4 and 5. It will be appreciated that even the circuits of FIGURES 4 and 5 involve the slight approximation of Equation 5. Substituting Equation 4 in Equation 6, we obtain the equation $$m=\sqrt{\frac{R(RCr-L)}{r(R^2C-L)}} \quad (7)$$

For the tunnel diode of FIGURE 1, from Equation 4, $w_m=7.25\times10^{10}$. It will be noted that the actual value of $w_m$ is slightly less than its approximate value as calculated from Equation 5. From Equation 7, $m=0.56$, which is slightly less than its approximate value as determined from Equations 5 and 6. From Equation 7 it will be seen that the value of *m* includes the expression $(RCr-L)$. This incorporates the inequality of Equation 2. Thus, the smaller L is compared with R*Cr*, the greater will be the value of *m*. For the critical degenerate case where $L=RCr$ the value of *m* becomes zero.

Comparing FIGURES 2 and 3 with FIGURES 4 and 5 it will be seen that the input impedance and the impedance of the first section 70 must be decreased in accordance with a decrease in the value of *m* from unity in order that $w_c$ be at least equal to $w_t$. As a consequence of the decreased input resistance and the decreased characteristic resistance of the initial section 70, the transformation ratio between sections 70 and 71 across the first diode 50 is reduced. In general the input resistance 2 and the corresponding characteristic resistance of the initial section 70 will not be related to the resistance of the initial diode 50 by such integral values as unity in FIGURES 2 and 3 and two in FIGURES 4 and 5. For example, in a design of an *m*-derived amplifier as in FIGURES 4 and 5 employing the more accurate value $m=0.56$, the input resistance 2 and the characteristic resistance of the initial section 70 would be reduced slightly below 50 ohms. This would correspondingly decrease not only the characteristic resistance of section 71 but also the transformation ratio between sections 70 and 71 across the initial diode 50.

It will be noted that in FIGURES 4 and 5 the gain cannot be further increased by adding more sections since series inductor 32 of section 72 has the minimum realizable inductance of 1/2 mμh. It will be appreciated that further *m*-derived sections of a tapered positive line would require lower characteristic resistances and consequently lower series inductance values. Where higher gain is required, the alternating line of FIGURES 7 and 8 must be employed.

Figures 5, 6:
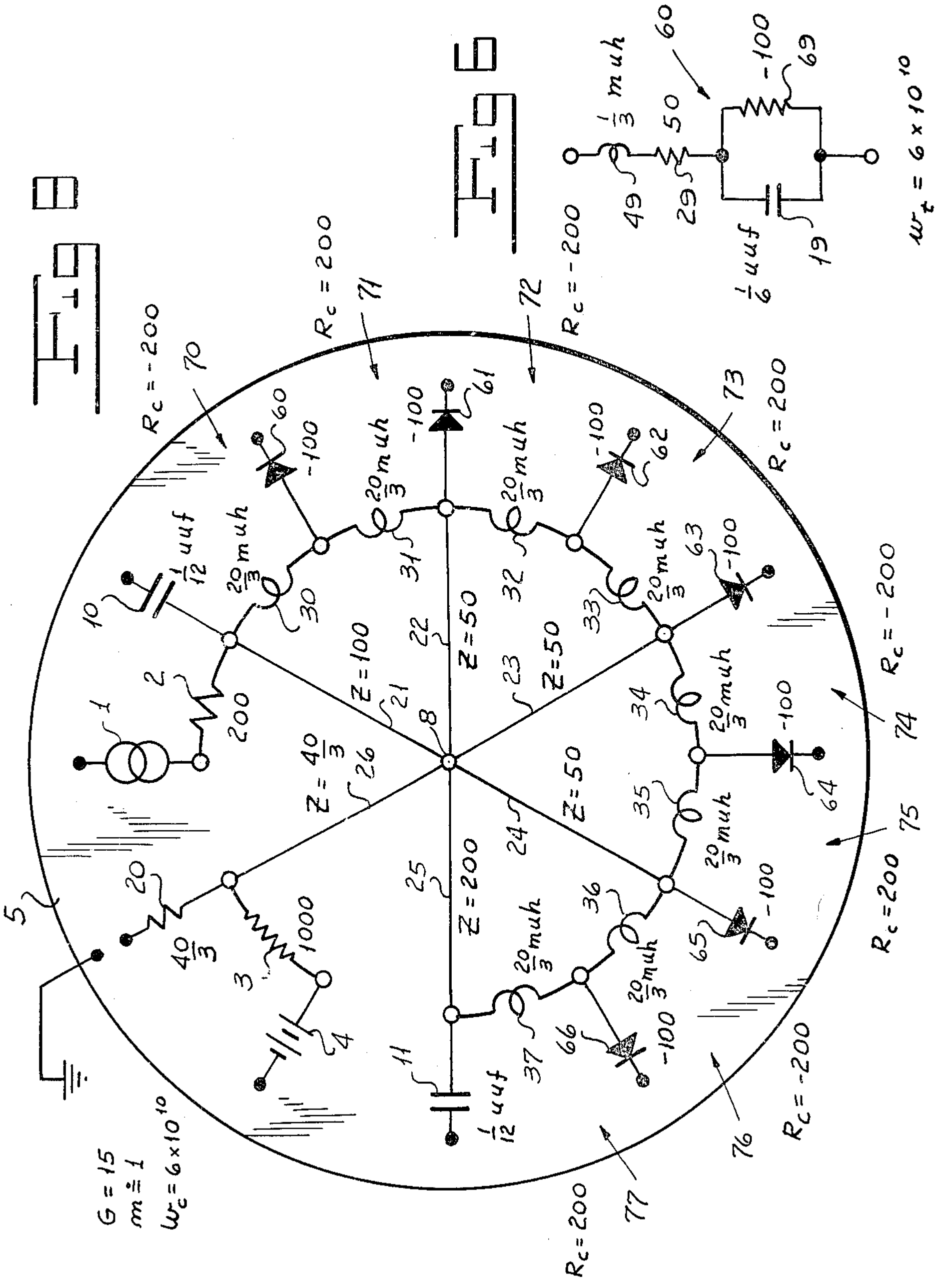
FIGURE 6 is a schematic view of the equivalent circuit of one of the tunnel diodes used in the tapered negative line and the alternating line.

Referring now to FIGURE 6 I have shown the equivalent circuit of one of the tunnel diodes, indicated generally by the reference numeral 60, which is used in the alternating line. The equivalent circuit includes a −100 ohm negative resistor 69 shunted by a 1/6 μμf. capacitor 19 in series with a 1/3 mμh. inductor 49 and a frequency dependent positive resistor 29 having a value of 50 ohms at the resistive cut-off frequency $w_t$. It will be noted that $R/r=2$ and consequently, from Equation 1, $$w_t=(RC)^{-1}=6\times10^{10}$$

From Equation 4, $w_m=12\times10^{10}$; and from Equation 6 or from Equation 7, $m=0.87$. Thus, for tunnel diode 60 the assumption of constant-*k* sections where *m* is equal substantially to unity is justified. Diodes 50 and 60 have the same resistive cut-off frequency $w_t$; but diode 60 must be of greater quality and more highly doped to provide an *R-C* time-constant which is one-third that of diode 50.

Figure 7:
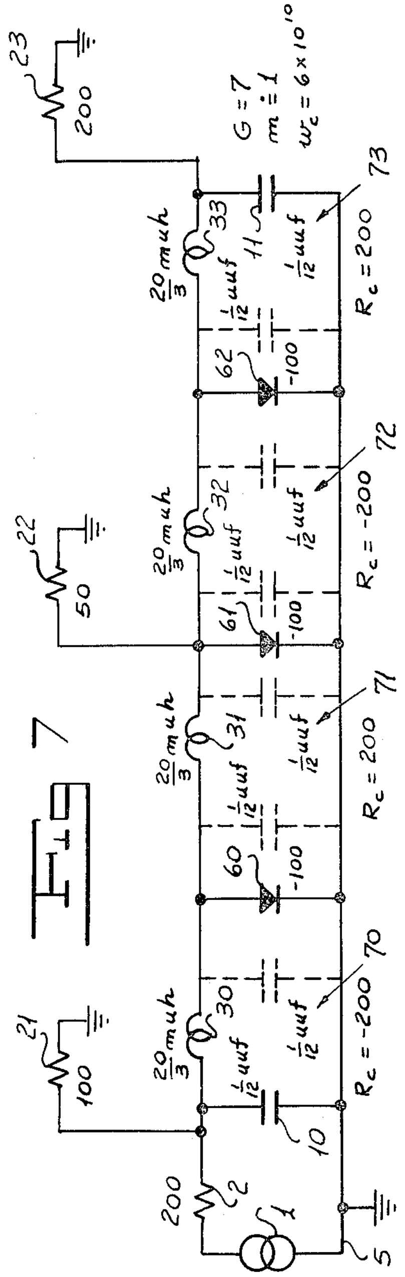
FIGURE 7 is a schematic view of an alternating line showing the division of diode junction capacitance between adjacent pi section.

Referring now to FIGURE 7, the signal source 1 having an internal resistance 2 of 200 ohms drives an alternating line comprising sections 70, 71, 72 and 73 having the respective characteristic resistances $R_c$ of −200, 200, −200 and 200 ohms. The sections are provided with respective series inductors 30, 31, 32 and 33 each having a value of 20/3 mμh. Diode 60 is inserted between section 70 and 71; a diode 61 is inserted between sections 71 and 72; and a diode 62 is inserted between sections 72 and 73. Section 70 is provided with an initial 1/12 μμf. capacitor 10; and section 73 is provided with a terminal 1/12 μμf. capacitor 11. The amplifier is provided with a common ground line 5. A first load resistor 21 of 100 ohms shunts capacitor 10 to ground. A second load resistor 22 of 50 ohms shunts diode 61 to ground. A third load resistor 23 of 200 ohms shunts capacitor 11 to ground. Each of sections 70 through 73 has a cut-off frequency $w_c$ of $6\times10^{10}$ which is at least equal to the diode resistive cut-off frequency $w_t$; and thus the amplifier is stable. Since the characteristic resistances of the sections on either side of each diode are of the same magnitude, the diode capacitance is evenly divided between adjacent sections. Section 70 has a terminal shunt capacitance of 1/12 $\mu\mu$f. and section 71 has an initial shunt capacitance of 1/12 $\mu\mu$f., the parallel combination being equal to the 1/6 $\mu\mu$f. junction capacitance 19 of diode 60. Likewise, diodes 61 and 62 supply the initial and terminal 1/12 $\mu\mu$f. shunt capacitances of section 72, the terminal 1/12 $\mu\mu$f. shunt capacitance of section 71, and the initial 1/12 $\mu\mu$f. shunt capacitance of section 73.

The sections on either side of each tunnel diode have characteristic resistances of equal magnitudes but of opposite polarities, the magnitudes of the characteristic resistances being twice the magnitude of negative resistance provided by a tunnel diode. Thus, sections 72 and 73 have respective characteristics resistances of —200 ohms and 200 ohms, the magnitudes of which are twice the magnitude of negative resistance provided by tunnel diode 62. Section 72 is terminated not only by tunnel diode 62 but also by section 73. The parallel combination of diode 62 and section 73 yields a resultant terminating negative resistance equal to the characteristic resistance of section 72. Section 73 is terminated in its characteristic resistance by load resistor 23. Section 70 is terminated not only by diode 60 but also by section 71. The parallel combination of diode 60 and section 71 yields a resultant terminating negative resistance equal to the characteristic resistance of section 70. Source 1, having an internal impedance 2 of 200 ohms, is loaded not only by resistor 21 but also by section 70. The parallel combination of load 21 and section 70 yields a resultant positive resistance of 200 ohms which is matched to the input resistance 2 of source 1. Section 71 is terminated by section 72, by resistor 22, and by diode 61. The parallel combination of these three components yields a resultant terminating positive resistance equal to the characteristic resistance of section 71. Each of the sections 71 through 73 is terminated in its characteristic resistance whether it be positive or negative. The parallel combination of loads 20 through 23 yields a resultant load of 200/7 ohms. The ratio of input resistor 2 to the parallel combination of load resistors 21 through 23 yields an amplifier gain G of seven.

The characteristic resistance $R_c$ of a filter section is determined by the radical $\sqrt{L/C}$, where L is the series inductance and C is the total shunt capacitance. For section 70 of FIGURE 2, $$L=\frac{10}{3}\times10^{-9}h;\ C=\frac{2}{6}\times10^{-12}f$$

and $$R_c=\sqrt{\frac{10}{3}\times10^{-9}\times\frac{6}{2}\times10^{12}}=100\text{ ohm.}$$

For section 71 of FIGURE 2, $$L=\frac{5}{3}\times10^{-9}h$$

$$C=\frac{2}{3}\times10^{-12}f$$

and $$R_c=\sqrt{\frac{5}{3}\times10^{-9}\times\frac{3}{2}\times10^{12}}=50\text{ ohms.}$$

For section 72 of FIGURE 2, $$L=\frac{10}{9}\times10^{-9}h$$

$$C=\frac{2}{2}\times10^{-12}f$$

and $$R_c=\sqrt{\frac{10}{9}\times10^{-9}\times\frac{2}{2}\times10^{12}}=100/3\text{ ohms.}$$

In extracting a radical, two roots are involved, one of which is positive. However, there does exist a negative root, which has heretofore been ignored. I have found that this negative root has a physical significance. Thus considering the two alternative roots, $$(8)\qquad R_c=\pm\sqrt{L/C}$$

The significance of Equation 8 is that a filter section has either one or the other of two characteristic resistances having equal magnitudes but opposite polarities. The L and C values of the section determine the magniude of the characteristic resistance; and the polarity of the characteristic resistance is determined by the polarity of the resistance terminating the section.

In FIGURE 7, sections 70 and 72 are terminated by negative resistances; $L=20/3\times10^{-9}h$; $C=2/12\times10^{-12}f$; and $R_c=-\sqrt{20/3\times10^{-9}\times12/2\times10^{12}}=200$ ohms.

In FIGURE 7, section 71 and 73 are terminated by positive restistances; and $$R_c=+\sqrt{20/3\times10^{-9}\times12/2\times10^{12}}=+200\text{ ohms.}$$

Each of the sections of FIGURE 7 has the same L and C valves, and hence the same magnitude of characteristic resistance. But since the terminating resistances of the sections are alternately positive and negative, the characteristic resistances of the sections are of alternate positive and negative values.

For a filter section terminated in its positive characteristic resistance, the output lags the input as a function of frequency. For frequencies approaching zero, the amount of phase lag likewise approaches zero. I have discovered that filter sections may have negative characteristic resistances and that, for a filter section terminated an its negative characteristic resistance, the output across the negative terminating resistance leads the input as a function of frequency. For frequencies approaching zero, the amount of phase lead likewise approaches zero. I have further found that the amount of phase lead of a section terminated in its negative characteristic resistance is equal to the amount of phase lag of a section terminated in its positive characteristic resistance from zero frequency to frequencies approaching the negative resistance cut-off frequency $w_t$.

If two adjacent line sections are terminated in characteristic resistances of opposite polarities then the voltage at the input of the first section will be in phase with the voltage at the output of the second section because of the equal and opposite phase shifts produced by the sections. In each embodiment of my invention, power gain results from a change in impedance levels, the voltage gain being unity. The voltage across each shunt leg is of the same magnitude. Thus, the input of the first section may be connected in parallel with the output of the second section without interference, since the voltages are in phase and of the equal magnitude. In FIGURE 8 it will be shown how the output loads 21 through 23 of FIGURE 7 may be combined in parallel to supply a single load resistor.

Referring now to FIGURE 8, I provide a flat circular conductive plate 5 which forms a ground plane. The amplifier of FIGURE 8 includes eight sections 70 through 77 having alternating characteristic resistances $R_c$ of —200 and 200 ohms. Sections 70 through 77 have respective 20/3 m$\mu$h. series inductances 30 through 37. The first section 70, having a negative characteristic resistance, is provided with an initial shunt 1/12 $\mu\mu$f. capacitor 10. The eighth section 77, having a positive characteristic resistance, is provided with a terminal 1/12 $\mu\mu$f. capacitor 11. I provide seven tunnel diodes 60 through 66 shunt connected between the eight sections 70 and 77. The 1/6 $\mu\mu$f. junction capacitance 19 of the tunnel diodes provides the initial and terminal 1/12 $\mu\mu$f. capacitance of sections 71 through 76, the terminal 1/12 $\mu\mu$f. shunt capacitance of section 70 and the initial 1/12 $\mu\mu$f. shunt capacitance of section 77. One terminal of generator 1 and of each of the capacitors 10 and 11 is connected to the ground plate 5. The cathode of each of diodes 60 through 66 is also connected to ground plate 5. The sections are disposed in a circular arrangement concentric with the center of ground plate 5. Inductors 30 through 37 of the alternating line are elevated above ground plate 5 and are supported by diodes 60 through 66 and capacitors 10 and 11. I provide the radially extending transmission lines 21 through 25 which are likewise elevated above the ground plate 5. Transmission lines 21 through 25 each terminate in common point 8 which is elevated above the center of ground plate 5. Each of transmission lines 21 through 25 is of the same length. Transmission line 21 is connected to the ungrounded end of capacitor 10 and has a characteristic impedance Z of 100 ohms. Transmission lines 22, 23 and 24, each having a characteristic impedance Z of 50 ohms, are connected to the respective anodes of diodes 61, 63 and 65. Transmission line 25 is connected to the ungrounded end of capacitor 11 and has a characteristic impedance Z of 200 ohms. Comparing FIGURES 7 and 8, it will be noted that the initial 100 ohm transmission line 21 of FIGURE 8 replaces the initial 100 ohm resistor 21 of FIGURE 7 and that the terminal 200 ohm transmission line 25 replaces the terminal 200 ohm load resistor 23. The amplifier of FIGURE 8 has eight sections instead of four sections as in FIGURE 7 and is provided with three intermediate 50 ohm transmission lines instead of one intermediate 50 ohm load resistor. Transmission lines 21 through 25 are connected to points on the alternating line at which the voltages are in phase. Since transmission lines 21 through 25 are of equal length, they produce equal phase shifts; and the loads may be combined at point 8 without interaction. Point 8 is connected by a line 26, elevated above the ground plate 5 and having a characteristic impedance Z of 40/3 ohms, to one terminal of a load resistor 20, having a value of 40/3 ohms, the other terminal of which is connected to the ground plate 5. The negative terminal of bias battery 4 is connected to ground plate 5. The positive terminal of battery 4 is connected through a 1000 ohm bias resistor 3 to the ungrounded terminal of resistor 20. The ratio of input resistor 2 to output resistor 20 yields a gain G of fifteen. Again, as in FIGURE 7, the cut-off frequency $w_c$ of the sections is $6\times10^{10}$. In FIGURE 7 the circular disposition of the alternating line, the combination of loads, and the biasing source have not been shown. In the alternating line the equal and opposite phase shifts produced by the positive and negative sections between load points result in voltages at such load points which are in phase and which can therefore be effectively connected in parallel without interaction.

Figure 9:
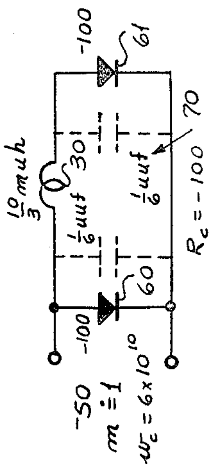
FIGURE 9 is a schematic view of a tapered negative line employing only one filter section showing the contribution of diode junction capacitance to the pi section filter.

Referring now to FIGURE 9 I have shown a tapered negative line section, indicated generally by the reference numeral 70, having a negative characteristic resistance $R_c$ of −100 ohms. In the tapered negative line I employ the same diode 60 shown in FIGURE 6. A −100 ohm diode 61 terminates section 70 in its negative characteristic resistance. Section 70 is provided with a series inductor 30 of 10/3 mμh. The terminal shunt capacitance of section 70 is provided by the 1/6 μμf. junction capacitance of diode 61. The initial 1/6 μμf. shunt capacitance of section 70 is provided by the junction capacitance 19 of a −100 ohm tunnel diode 60 which shunts the input of section 70. The cut-off frequency $w_c$ of section 70 is $6\times10^{10}$. The impedance looking into the tapered negative line of FIGURE 9 is −50 ohms, which is the resultant of the parallel combination of diode 60 and section 70.

Figure 10:
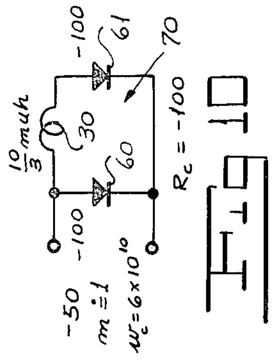
FIGURE 10 is a schematic view of the reduced equivalent circuit of FIGURE 9.

FIGURE 10 shows the reduced equivalent circuit of FIGURE 9. The tapered negative line of FIGURES 9 and 10 may be used to provide a negative resistance value one-half that of a single diode without the concomitant creation of biasing problems. In FIGURES 9 and 10 it will be noted that the section cut-off frequency $w_c$ is at least equal to the diode resistive cut-off frequency $w_t$. This is essential for stability of an amplifier incorporating the tapered negative line.

Figure 11:
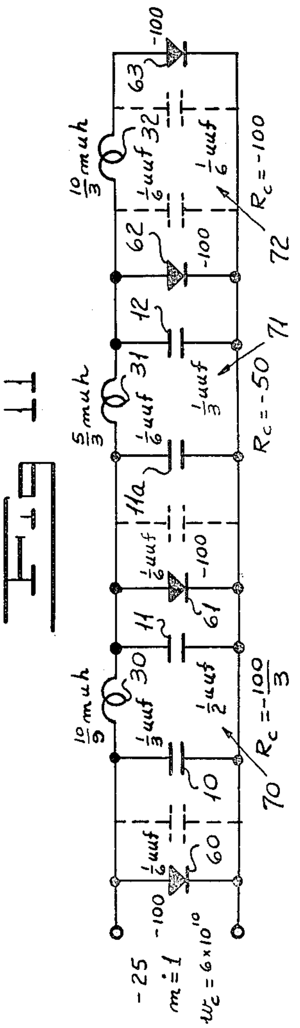
FIGURE 11 is a schematic view of a tapered negative line showing the contribution of diode junction capacitance to the filter sections.

Referring now to FIGURE 11, I have shown a tapered negative line having the sections 70, 71 and 72 with the respective negative characteristic resistance $R_c$ of −100/3, −50 and −100 ohms. Section 72 is terminated by a −100 ohm diode 63 in its negative characteristic resistance. Diode 62 is inserted between sections 71 and 72; diode 61 is inserted between sections 70 and 71; and diode 60 shunts the input of section 70. Sections 70 through 72 are provided with respective series inductances 30, 31 and 32 having the values 10/9 mμh., 5/3 mμh. and 10/3 mμh. The terminal 1/6 *μμf.* shunt capacitance of section 72 is provided by the junction capacitance of diode 63. The initial 1/6 μμf. shunt capacitance of section 72 is provided by the junction capacitance of diode 62. The terminal shunt capacitance of section 71 is provided by a 1/3 μμf. capacitor 12. The initial shunt capacitance of section 71 is provided by the 1/6 μμf. junction capacitance of diode 61 in combination with a 1/6 μμf. capacitor 11*a*. The terminal shunt capacitance of section 70 is provided by a 1/2 μμf. capacitor 11. The initial shunt capacitance of section 70 is provided by the 1/6 μμf. junction capacitance 19 of diode 60 in combination with a 1/3 μμf. capacitor 10. Each of the sections 70 through 72 has a cut-off frequency $w_c$ of $6\times10^{10}$ which is at least equal to the resistive cut-off frequency $w_t$ of the diodes; and thus the tapered negative line may be stably incorporated into an amplifier. The impedance looking into the negative tapered line is −25 ohms, which is the resultant parallel combination of diode 60 and section 70. Section 71 is terminated not only by diode 62 but also by section 72, the parallel combination of which yields a negative resistance equal to the characteristic resistance of section 71. Section 70 is terminated not only by diode 61 but also by section 71, the parallel combination of which yields a resultant negative resistance equal to the characteristic resistance of section 70.

Figure 12:
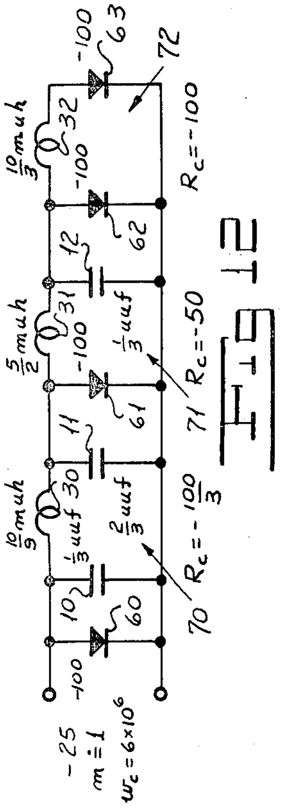
FIGURE 12 is a schematic view of the reduced equivalent circuit of FIGURE 11.

FIGURE 12 shows the reduced equivalent circuit of FIGURE 11. It will be noted that capacitors 11 and 11*a* of FIGURE 7, having the respective values of 1/2 μμf. and 1/6 μμf. have been combined in FIGURE 12 in a 2/3 μμf. capacitor 11 which shunts diode 61. The tapered negative line of FIGURES 11 and 12 may be used to provide a negative resistance value one-half that of FIGURES 9 and 10 and one-quarter that of a single diode, without biasing problems.

Figures 13, 14, 15:
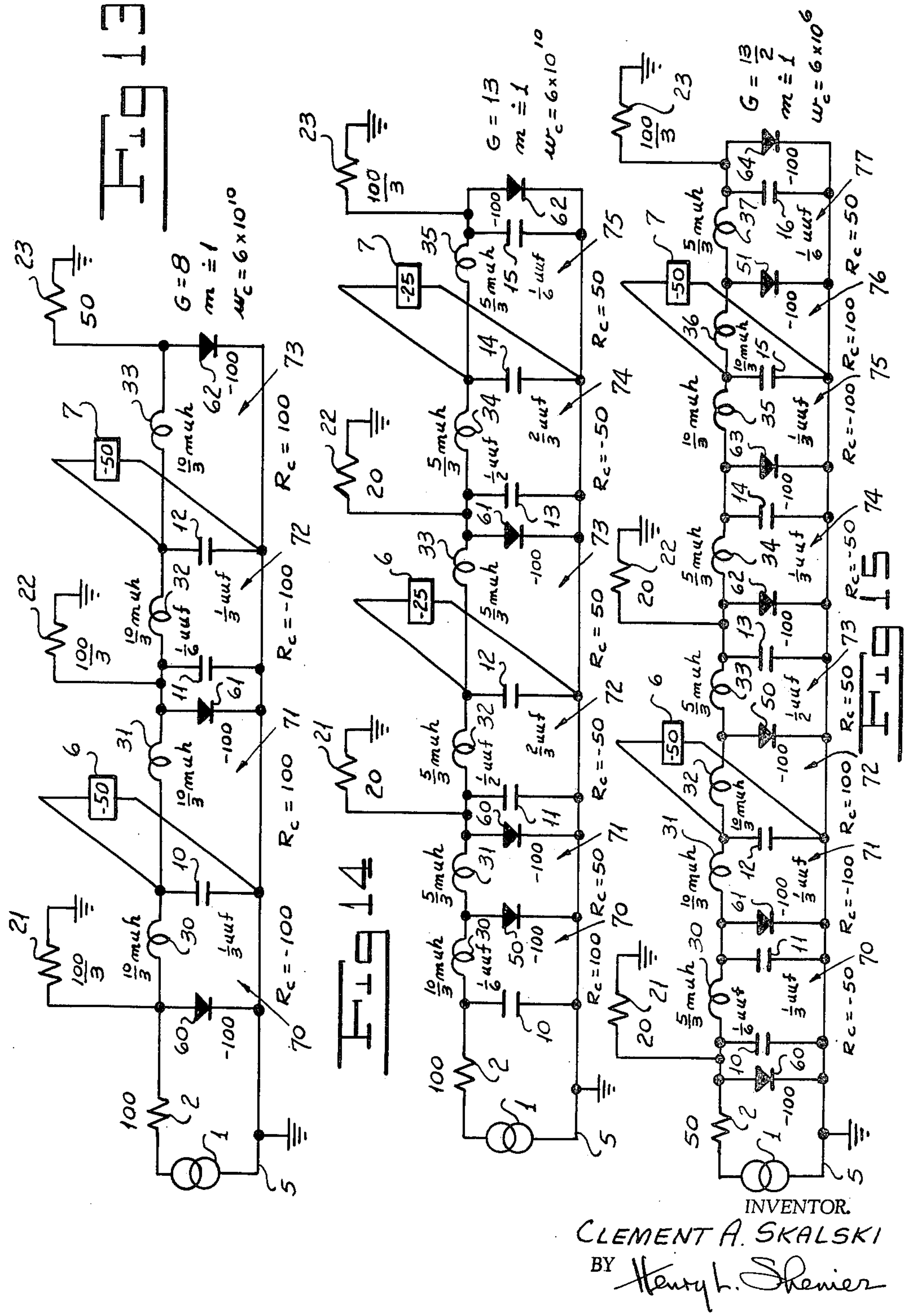
FIGURE 13 is a reduced schematic view showing an alternating line incorporating tapered negative line stubs.
FIGURE 14 is a reduced schematic view showing a tapered positive line pre-amplifier and a post amplifier comprising an alternating line incorporating tapered negative line stubs.
FIGURE 15 is a reduced schematic view showing a modified alternating line comprising both tapered positive line sections and tapered negative line sections and incorporating tapered negative line stubs.

Referring now to FIGURE 13, I have shown an alternating line similar to that of FIGURE 7 in which, however, the impedance level is reduced by a factor of two while employing tunnel diodes of the type 60 shown in FIGURE 6. The input resistance 2 is 100 ohms. Sections 70 through 73 have respective characteristic resistances $R_c$ of −100, 100, −100 and 100 ohms. Sections 70 through 73 have respective series inductances 30, 31, 32 an 33 of 10/3 mμh. each. Load resistors 21, 22 and 23 have respective values of 100/3, 100/3 and 50 ohms. A −50 ohm tapered negative line stub 6, as shown in FIGURES 9 and 10, shunts the alternating line between sections 70 and 71. An additional −50 ohm tapered negative line stub 7 shunts the alternating line between sections 72 and 73. Sections 70 and 71 share a common 1/3 μμf. shunt capacitor 10; and sections 72 and 73 share a common 1/3 μμf. shunt capacitor 12. Section 73 is terminated in a −100 ohm diode 62; and the input of section 70 is shunted by diode 60. Diode 61 is inserted between sections 71 and 72 which share a 1/6 μμf. capacitor 11. It will be appreciated that the alternating line of FIGURE 13 as well as that of FIGURE 7 will have a circular disposition about the ground plate 5, as shown in FIGURE 8, so that the load resistors 21, 22 and 23 may be effectively connected in parallel by transmission lines of equal length having corresponding characteristic impedances Z. The tapered negative line stubs 6 and 7 may extend radially of plate 5 and normal to the alternating line. The terminal 1/6 μμf. capacitance of section 73 is provided by the junction capacitance of diode 62; and the initial 1/6 μμf. capacitance of section 70 is provided by the junction capacitance of diode 60. The required 1/3 μμf. shunt capacitance shared by sections 71 and 72 is provided partly by capacitor 11 and partly by the 1/6 μμf. junction capacitance of diode 61. In FIGURE 13 the tunnel diodes 60 and 62 may be provided because of the impedance level is half that of FIGURE 7. Section 73 is terminated not only by diode 62 but also by load resistor 23, the parallel combination of which yields a resultant positive resistance equal to the characteristic resistance of section 73. Section 72 is terminated not only by tapered negative line stub 7 but also by section 73, the parallel combination of which yields a negative resistance equal to the characteristic resistance of section 72. Section 71 is terminated by diode 61, by load resistor 22 and by section 72. The parallel combination of these three components yields a resultant positive resistance equal to the characteristic resistance of section 71. Similarly, the parallel combination of tapered negative line stub 6 and section 71 terminates section 70 in its negative characteristic resistance. Input source 1, having an internal resistance 2 of 100 ohms, sees diode 60, section 70 and load resistor 21. The parallel combination of these three components yields a positive resistance of 100 ohms which is matched to the internal resistance 2 of generator 1. Sections 70 through 73 as well as the sections of the tapered line stubs 6 and 7 have a cut-off frequency $w_c$ of $6\times10^{10}$ which is at least equal to $w_t$; and thus the amplifier is stable. The parallel combination of loads 21 through 23 yields a resultant load of 100/8 ohms. Hence, the amplifier gain G is eight.

Referring now to FIGURE 14, I have shown a positive tapered line pre-amplifier comprising sections 70 and 71 which drives a post amplifier comprising alternating line sections 72 through 75. The tapered positive line pre-amplifier sections 70 and 71 are identical to those shown in FIGURES 2 and 3. In FIGURE 14, for purposes of clarity, I have shown sections 70 and 71 as being constant-*k* sections with *m* substantially equal to unity even though, as previously pointed out, this is not very accurate for tunnel diode 50. The alternating line post amplifier includes load resistors 21, 22 and 23 having respective values of 20 ohms, 20 ohms and 100/3 ohms. Sections 72 through 75 have alternating positive and negative characteristics resistances of 50 ohms. Thus, the impedance level of the alternating line post amplifier of FIGURE 14 is one-half that of FIGURE 13 and one-quarter that of FIGURE 7. As in FIGURES 2 and 3, diode 50 is inserted between sections 70 and 71. Diodes 60 and 61 are inserted between sections 71 and 72 and between sections 73 and 74 respectively. Diode 62 terminates section 75. Sections 71 and 72 share 1/2 μμf. capacitor 11. Sections 72 and 73 share a 2/3 μμf. capacitor 12. Sections 73 and 74 share a 1/2 μμf. capacitor 13. Sections 74 and 75 share a 2/3 μμf. capacitor 14. Section 75 is provided wtih a terminal 1/6 μμf. capacitor 15. Sections 72 through 75 have respective series inductances 32, 33, 34 and 35 of 3/5 mμh. each. A —25 ohm tapered negative line stub 6, as shown in FIGURES 11 and 12, shunts the alternating line between sections 72 and 73. An additional —25 ohm tapered negative line stub 7 shunts the alternating line between sections 74 and 75. It will be appreciated that the alternating line post amplifier of FIGURE 14 will have a circular disposition about the ground plate 5, as shown in FIGURE 8, so that load resistors 20 through 23 may be effectively connected in parallel by transmission lines of equal length having appropriate characteristic impedances Z. The tapered negative line stubs 6 and 7 may extend radially of plate 5 and normal to the alternating line. The terminal 1/3 μμf. capacitance of section 75 is supplied by capacitor 15 in combination with the junction capacitance of diode 62. The required 2/3 μμf. shunt capacitance shared by sections 73 and 74 is supplied by capacitor 13 in combination with the junction capacitance of diode 61. The required 2/3 μμf. shunt capacitane shared by sections 71 and 72 is supplied partly by capacitor 11 and partly by the 1/6 μμf. junction capacitance 19 of diode 60. Section 75 is terminated not only by diode 62 but also by load resistor 23, the parallel combination of which yields a resultant positive resistance equal to the characteristic resistance of section 75. Section 74 is terminated not only by tapered negative line stub 7 but also by section 75, the parallel combination of which yields a resultant negative resistance equal to the characteristic resistance of section 74. Section 73 is terminated by diode 61, by load resistor 22, and by section 74. The parallel combination of these three components yields a resultant positive resistance equal to the characteristic resistance of section 73. Similarly, the parallel combination of tapered negative line stub 6 and section 73 terminates section 72 in its negative characteristic resistance. Section 71 is terminated by diode 60, by load resistor 21 and by section 72. The parallel combination of these three components yields a positive resistance equal to the characteristic resistance of section 71. As in the tapered positive line of FIGURES 2 and 3, the combination of diode 50 and section 71 terminates section 70 in its positive characteristic resistance of 100 ohms which is matched to the 100 ohm input resistance 2. The positive tapered line sections 70 and 71, the alternating line sections 72 through 75, and the sections of the negative line stubs 6 and 7 have a cut-off frequency $w_c$ of $6\times10^{10}$ which is at least equal to the resistive cut-off frequenct $w_t$ of the diodes; and thus the stability of the amplifier is assured. The parallel combination of loads 21 through 23 yields a resultant load of 100/13 ohms. Hence, the amplifier gain G is thirteen.

Referring now to FIGURE 15, I have shown a modified alternating line having two positive sections and two negative sections between load points. The alternating line includes eight sections, 70 through 77, having the respective characteristic resistances $R_c$ of —50, —100, 100, 50, —50 —100, 100 and 50 ohms. Sections 70 through 77 are provided with respective series inductances 30 through 37 having the values 5/3 mμh., 10/3 mμh., 10/3 mμh., 5/3 mμh., 5/3 mμh., 10/3 mμh., 10/3 mμh., and 5/3 mμh. Load resistors 21, 22 and 23 have the respective values 20 ohms, 20 ohms, and 100/3 ohms. Signal source 1 has a resistance 2 of 50 ohms. Sections 70 and 71 form a tapered negative line as do sections 74 and 75. Sections 72 and 73 form a tapered positive line as do sections 76 and 77. The tunnel diodes 50 and 51 employed with tapered positive lines are inserted between sections 72 and 73 and between sections 76 and 77, respectively. All other tunnel diodes must be of the higher quality type shown in FIGURE 6. Section 77 is terminated in a diode 64 and a 1/6 μμf. capacitor 16. Sections 75 and 76 share a 1/3 μμf. capacitor 15. A tunnel diode 63 is inserted between sections 74 and 75 which share a 1/3 μμf. capacitor 14. Diode 62 is inserted between sections 73 and 74 which share a common 1/2 μμf. capacitor 13. Sections 71 and 72 share a 1/3 μμf. capacitor 12. Diode 61 is inserted between sections 70 and 71 which share a common 1/3 μμf. capacitor 11. The input of section 70 is shunted by diode 60 and a 1/6 μμf. capacitor 10. Capacitor 12 is shunted by a —50 ohm tapered negative line stub 6 shown in FIGURES 9 and 10. An additional —50 ohm tapered negative line stub 7 shunts capacitor 15. It will be appreciated that the modified alternating line of FIGURE 15 will have a circular disposition about the ground plate 5, as shown in FIGURE 8, so that transmission lines of equal length may effectively connect the load resistors 21 through 23 in parallel. Again, the tapered negative line stubs 6 and 7 may extend radially of ground plate 5 and normal to the alternating line. The required 1/3 μμf. terminal shunt capacitance of section 77 is supplied by capacitor 16 in combination with the junction capacitance of diode 64. The required 1/2 $\mu\mu$f. shunt capacitance shared by sections 76 and 77 is provided entirely by the 1/2 $\mu\mu$f. junction capacitance of diode 51. The required 1/2 $\mu\mu$f. shunt capacitance shared by sections 74 and 75 is supplied partly by capacitor 14 and partly by the junction capacitance of diode 63. The required 2/3 $\mu\mu$f. shunt capacitance shared by sections 73 and 74 is supplied by capacitor 13 in combination with the junction capacitance of diode 62. The 1/2 $\mu\mu$f. junction capacitance 19 of diode 50 supplies the required capacitance shared by sections 72 and 73. Capacitor 11 and the junction capacitance of diode 61 supply the required 1/2 $\mu\mu$f. shunt capacitance shared by sections 70 and 71. The initial 1/3 $\mu\mu$f. shunt capacitance of section 70 is provided partly by capacitor 10 and partly by the 1/6 $\mu\mu$f. junction capacitance 19 of diode 60. Section 77 is terminated by load resistor 23 and diode 64, the parallel combination of which terminates section 77 in its positive characteristic resistance. The parallel combination of diode 51 and section 77 terminates section 76 in its positive characteristic resistance. The parallel combination of tapered negative line stub 7 and section 76 terminates section 75 in its negative characteristic resistance. The parallel combination of diode 63 and section 75 terminates section 74 in its negative characteristic resistance. Section 73 is terminated by load resistor 22, diode 62 and section 74. The parallel combination of these three components yields a resultant positive resistance equal to the characteristic resistance of section 73. Similarly, sections 72, 71 and 70 are terminated in their respective characteristic resistances of 100 ohms, −100 ohms and −50 ohms. The input source 1 having an internal resistance 2 of 50 ohms sees load resistor 21, diode 60 and section 70. The parallel combination of these three components yields a resultant positive resistance of 50 ohms which is matched to the 50 ohm input resistance 2. In FIGURE 15, for purposes of clarity, I have shown the tapered positive line sections 72 and 73 and also 76 and 77 as being constant-*k* sections with *m* substantially equal to unity even though the approximation is not very accurate. Sections 70 through 77 as well as the sections of the tapered negative line stubs 6 and 7 have a cut-off frequency $w_c$ which is at least equal to the diode cut-off frequency $w_t$; and hence the stability of the amplifier is assured. The parallel combination of loads 21 through 23 yields a resultant load of 100/13. Accordingly, the amplifier gain G is 13/2. Sections 70 through 73 are in series between the load points of resistors 21 and 22. Each of sections 70 and 71 provide a phase lead and each of sections 72 and 73 provide a phase lag. However, the phase lags of sections 72 and 73 are canceled by the equal and opposite phase leads of sections 70 and 71 so that the voltages across load resistors 21 and 22 are in phase. Similarly, the phase lag of each of positive sections 76 and 77 is compensated by the equal and opposite phase lead of each of negative sections 74 and 75 so that the voltages across load resistors 22 and 23 are in phase. Thus, resistors 21 through 23 may be parallel without interaction since they are connected to load points having voltages of the same phase and magnitude. As will be appreciated by those skilled in the art, any even number of positive and negative sections may be employed between the load points in an alternating line as long as the number of positive sections is equal to the number of negative sections. In FIGURE 15, tapered negative line sections appear not only in series in the alternating line but also in the shunt connected stubs 6 and 7.

As has been previously pointed out, the transformation ratio between adjacent sections in the tapered positive line will not in general be a ratio of small integers. In FIGURES 14 and 15, I have shown constant-*k* tapered positive line sections because this results in an integral transformation ratio. In the tapered negative line, the transformation ratio between adjacent sections may always be in the ratio of small integers. In the alternating line the magnitude of the transformation ratio between adjacent sections may always be made unity so that adjacent sections have characteristic resistance of equal magnitudes but of opposite polarities. However, as will be appreciated by those skilled in the art the principle of the alternating line is still applicable even though the absolute impedance transformation ratio between adjacent sections is made different from unity so that the magnitude of the positive characteristic resistance of one section is different from the magnitude of the negative characteristic resistance of the other section. As will be further appreciated by those skilled in the art, I may employ T filter sections of either constant-*k* or *m*-derived type instead of the pi filter sections shown. In the tapered positive line of FIGURES 2 through 5, T filter sections may readily be employed.

It will be noted that in each of the figures a diode has been inserted wherever sufficient shunt capacity is available to be absorbed by the junction capacitance of the diode. However, it will be evident that only one diode is connected at a point on the series line or on a parallel stub. For example, in FIGURE 13, capacitors 10 and 12 have a magnitude sufficient to absorb the shunt capacitance of a tunnel diode. However, no tunnel diode may be provided since the stubs 6 and 7 include an initial diode. For the same reason no diode may absorb a portion of the capacitance of capacitors 12 and 14 of FIGURE 14 or of capacitors 12 and 15 of FIGURE 15. From the foregoing it will be seen that no two diodes are directly connected in parallel at a single point on a series line or stub, since this would more than double the lead inductance and cause biasing instability.

It will be seen that I have accomplished the objects of my invention. In both the tapered positive line and the tapered negative line I provide a plurality of filter sections having predetermined ratios of characteristic resistance enabling diodes to be effectively connected in parallel without instability. In the alternating line, alternate sections of positive and negative characteristic resistance effectively enable filter sections to be connected in parallel at reasonable impedance levels so that series inductances are physically realizable. In both the alternating line and the tapered negative line, the cut-off frequency $w_c$ of the sections may not exceed the time-constant frequency of the diode which is $(RC)^{-1}$ radians/second. However, in the tapered positive line, the cut-off frequency of the sections may be made any desired multiple of the diode time-constant frequency $(RC)^{-1}$ by reducing both the characteristic resistance of the two sections on either side of the diode and correspondingly reducing the transformation ratio between the two sections across a given diode. The tapered positive line is especially desirable where extremely wide band width is required but small gain values will suffice. Where large gains are required, then the alternating line either alone or in combination with tapered negative lines must be employed, although at a corresponding sacrifice in band width.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A negative resistance distributed amplifier including in combination a low-pass filter comprising a first and a second section connected in series, a signal source, means coupling the source to the first section, a negative resistance device, means connecting the device in shunt with the filter between the first and second sections, the second section having a characteristic resistance, means terminating the second section in its characteristic resistance, and the first section having a characteristic resistance equal to the parallel equivalent of the negative resistance of the device and the characteristic resistance of the second section.

2. A negative resistance distributed amplifier including in combination a low-pass filter comprising a first and a second section connected in series, a signal source, means coupling the source to the first section, a negative resistance device having a certain cut-off frequency, means connecting the device in shunt with the filter between the first and second sections, the second section having a characteristic resistance, means terminating the second section in its characteristic resistance, the first section having a characteristic resistance equal to the parallel equivalent of the negative resistance of the device and the characteristic resistance of the second section, and the first and second sections each having a cut-off frequency at least equal to that of the device.

3. A negative resistance distributed amplifier including in combination a low-pass filter comprising a first and a second section connected in series, the first and second sections being $m$-derived and having characteristic resistances of predetermined polarities, a signal source, means coupling the source to the first section, a negative resistance device, means connecting the device in shunt with the filter between the first and second sections, means terminating the second section in its characteristic resistance, the first section having a characteristic resistance equal to the parallel equivalent of the negative resistance of the device and the characteristic resistance of the second section.

4. A negative resistance distributed amplifier including in combination a low-pass filter comprising a first and a second section connected in series, a signal source having an internal resistance, means connecting the source to the first section, a negative resistance device, means connecting the device in shunt with the filter between the first and second sections, the first section having a positive characteristic resistance equal to the source resistance, the second section having such positive characteristic resistance that the parallel equivalent of such resistance and the negative resistance of the device is equal to the positive characteristic resistance of the first section.

5. A negative resistance distributed amplifier including in combination a low-pass filter comprising a first and a second section connected in series, a signal source, means coupling the source to the first section, a negative resistance device, means connecting the device in shunt with the filter between the first and second sections, the second section having a negative characteristic resistance, means terminating the second section in its negative characteristic resistance, and the first section having a negative characteristic resistance equal to the parallel equivalent of the negative resistance of the device and the negative characteristic resistance of the second section.

6. A negative resistance distributed amplifier including in combination a low-pass filter comprising a first and a second section connected in series, a signal source, means coupling the source to the first section, a negative resistance device, means connecting the device in shunt with the filter between the first and second sections, the first section having a negative characteristic resistance, the second section having such positive characteristic resistance that the parallel equivalent of such positive resistance and the negative resistance of the device is equal to the negative characteristic resistance of the first section, and means terminating the second section in its positive characteristic resistance.

7. A negative resistance distributed amplifier including in combination a low-pass filter comprising a first and a second section connected in series, the first section having an input terminal, the second section having an output terminal, a signal source, means coupling the source to the first section input terminal, a negative resistance device, means connecting the device in shunt with the filter between the first and second sections, the first section having a negative characteristic resistance, the second section having such positive characteristic resistance that the parallel equivalent of such positive resistance and the negative resistance of the device is equal to the negative characteristic resistance of the first section, the first and second sections having the same cut-off frequency, and two transmission lines of the same length connecting the first section input terminal and the second section output terminal to a common resistive termination, the second section being terminated in its positive characteristic resistance.

8. A negative resistance distributed amplifier including in combination a low-pass filter comprising an even number of sections connected in series, the first of the series-connected sections having an input terminal, the last of the series-connected sections having an output terminal, a signal source, means coupling the source to the first section input terminal, a negative resistance device, means connecting the device in shunt with the filter at a point dividing the filter into two groups each containing half said even number of sections, and two transmission lines connecting the first section input terminal and the last section output terminal to a common termination.

9. A negative resistance distributed amplifier including in combination a low-pass filter comprising an even number of series-connected sections disposed along a portion of the circumference of a circle, a pair of radially extending transmission lines of the same length connecting the terminal sections to a common centrally disposed termination, a negative resistance device, and means connecting the device in shunt with the filter at a point dividing the filter into two groups each containing half said even number of sections.

10. A negative resistance distributed amplifier including in combination a low-pass filter comprising a first and a second section connected in series, the first section having a characteristic resistance of a certain magnitude and polarity, the second section having a characteristic resistance which differs from that of the first section, a negative resistance device, and means connecting the device in shunt with the filter between the sections.

11. A negative resistance distributed amplifier including in combination a low-pass filter comprising a first and a second section connected in series, the first section having a characteristic resistance of a certain polarity and magnitude, the second section having a characteristic resistance which differs from that of the first section, the first section having an input terminal and the second section having an output terminal, a first and a second negative resistance device, means connecting the first device in shunt with the filter between the sections, and means connecting the second device in shunt with the filter to one of said terminals.

12. A negative resistance distributed amplifier including in combination a low-pass filter having a characteristic resistance of a certain magnitude, a negative resistance device, and means including the device for terminating the filter in a resultant impedance which is equal to its negative polarity characteristic resistance.

13. A negative resistance distributed amplifier including in combination a low-pass filter having an input and an output and having a characteristic resistance of a certain magnitude, a first and a second negative resistance device, means including the first device for terminating the output of the filter in a resultant impedance which is equal to its negative polarity characteristic resistance, and means connecting the second device in shunt with the input of the filter.

References Cited by the Examiner

UNITED STATES PATENTS

| | | | |
|---|---|---|---|
| 2,270,644 | 1/1942 | Blackman | 333—80 X |
| 2,274,347 | 2/1942 | Rust et al. | 333—80 X |
| 2,403,151 | 7/1946 | Roberts | 330—54 X |
| 2,424,238 | 7/1947 | Johnson | 333—80 X |
| 2,585,571 | 2/1952 | Mohr | 330—53 X |
| 2,720,627 | 10/1955 | Llewellyn | 333—80 X |
| 2,788,496 | 4/1957 | Linvill | 330—3 X |
| 2,835,872 | 5/1958 | Pierce | 333—32 |
| 2,958,046 | 10/1960 | Watters | 330—54 |
| 3,187,266 | 6/1965 | Marshall | 330—34 |

OTHER REFERENCES

Kimbark, E. W.: Electrical Transmission of Power and Signals, John Wiley & Sons, Inc., New York, 1949, pp. 304–305 relied on.

ROY LAKE, *Primary Examiner.*

JOHN KOMINSKI, *Examiner.*

S. H. GRIMM, *Assistant Examiner.*